(12) United States Patent
Bowers et al.

(10) Patent No.: US 6,394,831 B1
(45) Date of Patent: May 28, 2002

(54) RETENTION MEMBER FOR CARD EDGE CONNECTOR

(75) Inventors: Michael Deen Bowers, Harrisburg, PA (US); Robert Thomas Hirsbrunner, Crystal Lake, IL (US)

(73) Assignee: The Whitaker Corporation, Wilmington, DE (US)

( * ) Notice: Subject to any disclaimer, the term of this patent is extended or adjusted under 35 U.S.C. 154(b) by 0 days.

(21) Appl. No.: 09/632,420

(22) Filed: Aug. 4, 2000

Related U.S. Application Data

(60) Provisional application No. 60/147,573, filed on Aug. 6, 1999.

(51) Int. Cl.[7] .............................................. H01R 13/62

(52) U.S. Cl. ....................................... 439/327; 439/923

(58) Field of Search ................................. 439/327, 366, 439/358, 352, 325, 310, 270, 257–267, 923

(56) References Cited

U.S. PATENT DOCUMENTS

| 4,346,952 | A | * | 8/1982 | Bright et al. | 439/76.1 |
|---|---|---|---|---|---|
| 5,494,451 | A | | 2/1996 | Bowers | 439/328 |
| 5,690,499 | A | | 11/1997 | Howell et al. | 439/157 |
| 5,943,218 | A | * | 8/1999 | Liu | 439/352 |
| 6,007,357 | A | | 12/1999 | Perino et al. | 439/327 |
| 6,056,579 | A | * | 5/2000 | Richards, III et al. | 439/327 |
| 6,074,237 | A | * | 6/2000 | Lee | 439/358 |

* cited by examiner

*Primary Examiner*—Neil Abrams
*Assistant Examiner*—Phuong Dinh

(57) ABSTRACT

A retention member (40) for a card edge connector (4) is provided for securing a printed circuit card (6) in the connector. The retention member is formed as a spring clip having free ends (42) secured to releasably attached to ends of the electrical connector. Tabs (44) are received in notches (32) to further secure the assembly. Slots (48) are formed in the spring clip to receive corners of the printed circuit card. The spring clip may have bowed portions to further strengthen the retention of the printed circuit card. The spring clip is released from the connector by inserting a tool into lateral tool slots (13).

18 Claims, 4 Drawing Sheets

US 6,394,831 B1

RETENTION MEMBER FOR CARD EDGE CONNECTOR

This Application claims benefit of Provision No. 60/147,573 filed Aug. 6, 1999.

FIELD OF THE INVENTION

The invention is directed toward a retention member for retaining circuit cards within a card edge connector.

BACKGROUND OF THE INVENTION

Electrical connectors for electrically interconnecting circuit traces on the edge of a printed circuit card to circuitry such as that which is commonly routed on a second printed circuit board, or mother board, are well known.

In order to insure electrical reliability at the circuit card edge/electrical connector interface, the circuit card must be securely retained within the card receiving slot of the card edge connector. And, such retention must be sufficiently robust to withstand the rigors presented by typical applications such as heat vibration and insertion and removal. U.S. Pat. No. 5,690,499 shows a card edge connector having retention latches for holding a circuit card within the card receiving slot of the card edge connector. Such card edge connectors are commonly used for electrically interconnecting dual in-line memory modules (DIMMs) to a computer mother board. For these applications, card edge connectors, such as the one shown in U.S. Pat. No. 5,690,499, are effective at retaining the circuit card within the card edge connector. However, certain applications require that bulkier and heavier circuit cards be secured within the connector. In such applications, the circuit card is much more likely to be displaced relative the card receiving slot thereby resulting in electrical discontinuities between the connector and the card. For instance, today card edge connectors are commonly used for receiving circuit cards with computer processors mounted within processor sockets and equipped with large heavy heat sinks and, in some cases, cooling fans. Because most of the mass of such a circuit card is concentrated away from the card edge, these cards tend to be top-heavy and are therefore more difficult to reliably secure within a card edge connector.

Therefore, what is needed is a low cost sturdy and reliable device for securing circuit cards within a card edge connector.

SUMMARY OF THE INVENTION

An electrical connector is disclosed having a housing with a card-receiving recess for receiving an edge of a printed circuit card therein. A generally U-shaped clip is provided having free ends attachable to a retention area on the housing with slots disposed remote from the free ends for receipt of corners of the printed circuit card.

Alternatively, an electrical connection is provided having a printed circuit card and a housing having a card-receiving recess for receiving an edge of the printed circuit card. A generally U-shaped clip is wrapped around a top and sides of the printed circuit card and releasably attached to the housing at free ends of the clip.

Furthermore, a clip for securing a printed circuit card in an electrical connector is disclosed having a generally U-shaped body terminating at free ends. Slotted corner portions are located remote of the free ends and connected thereto by bowed portions.

In a further alternative embodiment, an assembly is disclosed having a printed circuit card and an electrical connector having a card-receiving recess for receiving an edge of the printed circuit card. A generally U-shaped clip is diposed around the printed circuit card and ends of the electrical connector, thereby securing the printed circuit card in the electrical connector.

In yet another embodiment, an electrical connector is provided having a housing with a card-receiving recess for receiving an edge of a printed circuit card. A notch is disposed in each end of the housing and a tool receiving slot is located proximate each notch.

BRIEF DESCRIPTION OF THE DRAWINGS

Embodiments of the present invention will now be discussed by way of example with reference to the following drawings, in which.

DETAILED DESCRIPTION OF THE INVENTION

Figure 2:
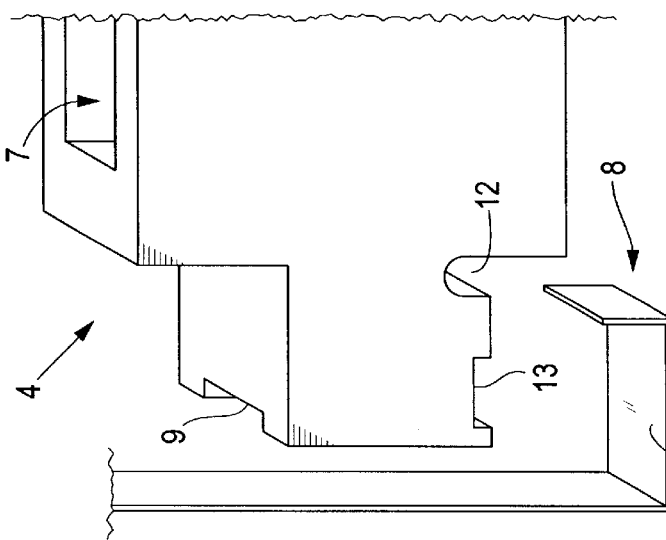
FIG. 2 is a partial isometric view of a spring clip and electrical connector in accordance with the present invention.
Figure 1:
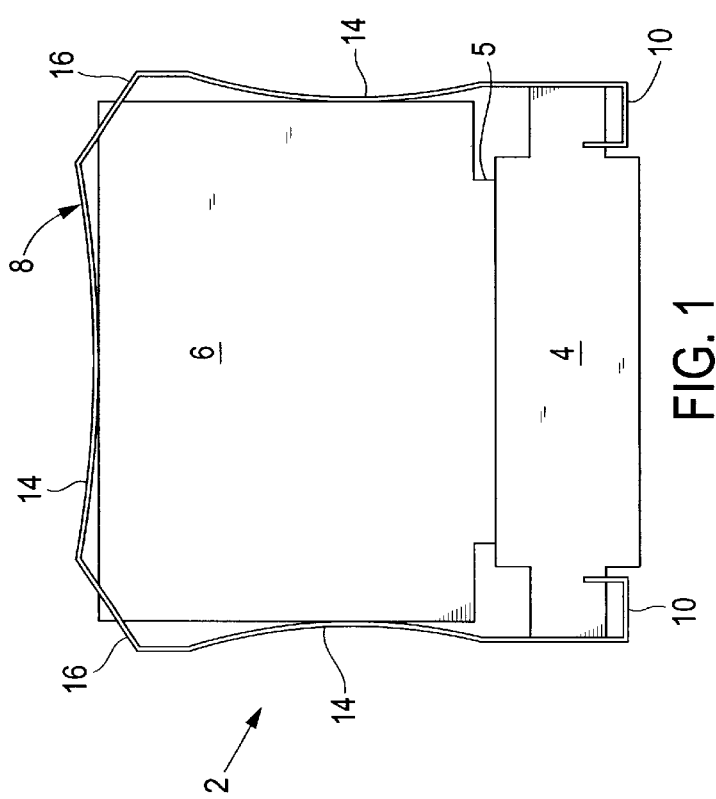
FIG. 1 is a side view of an embodiment of the present invention.
Figure 4:
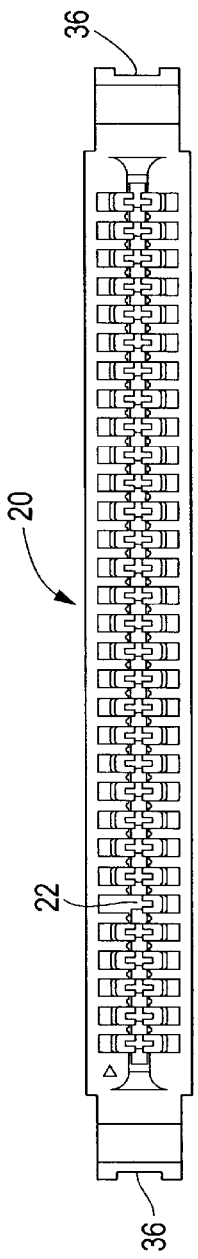
FIG. 4 is a top view of an electrical connector in accordance with the present invention.

With reference to FIGS. 1 and 2, an embodiment of the present invention is shown generally at 2. A card edge connector 4 has a card-receiving recess 7 which receives a card edge 5 of printed circuit board 6 such that contacts (not shown) within the card edge connector 4 engage conductive circuit pads of the printed circuit board which electrically interconnect electronic components and circuit traces on the printed circuit board 6. A spring clip 8 grips the connector 4 and surrounds the printed circuit board 6 such that the connector 4 and printed circuit board 6 are held together without the need for other mounting structure.

The spring clip 8, shown in FIG. 1, is generally U-shaped having free ends 10 which engage notches 12 of the card edge connector 4. The clip 8 includes bowed sections 14 to provide spring forces which assists in retention of the printed circuit board within card edge connector 4. Remote from the connector 4, the spring clip 8 includes slotted corners 16 into which the corners of the printed circuit board 6 are received, thereby stabilizing the assembly 2.

Figure 3:
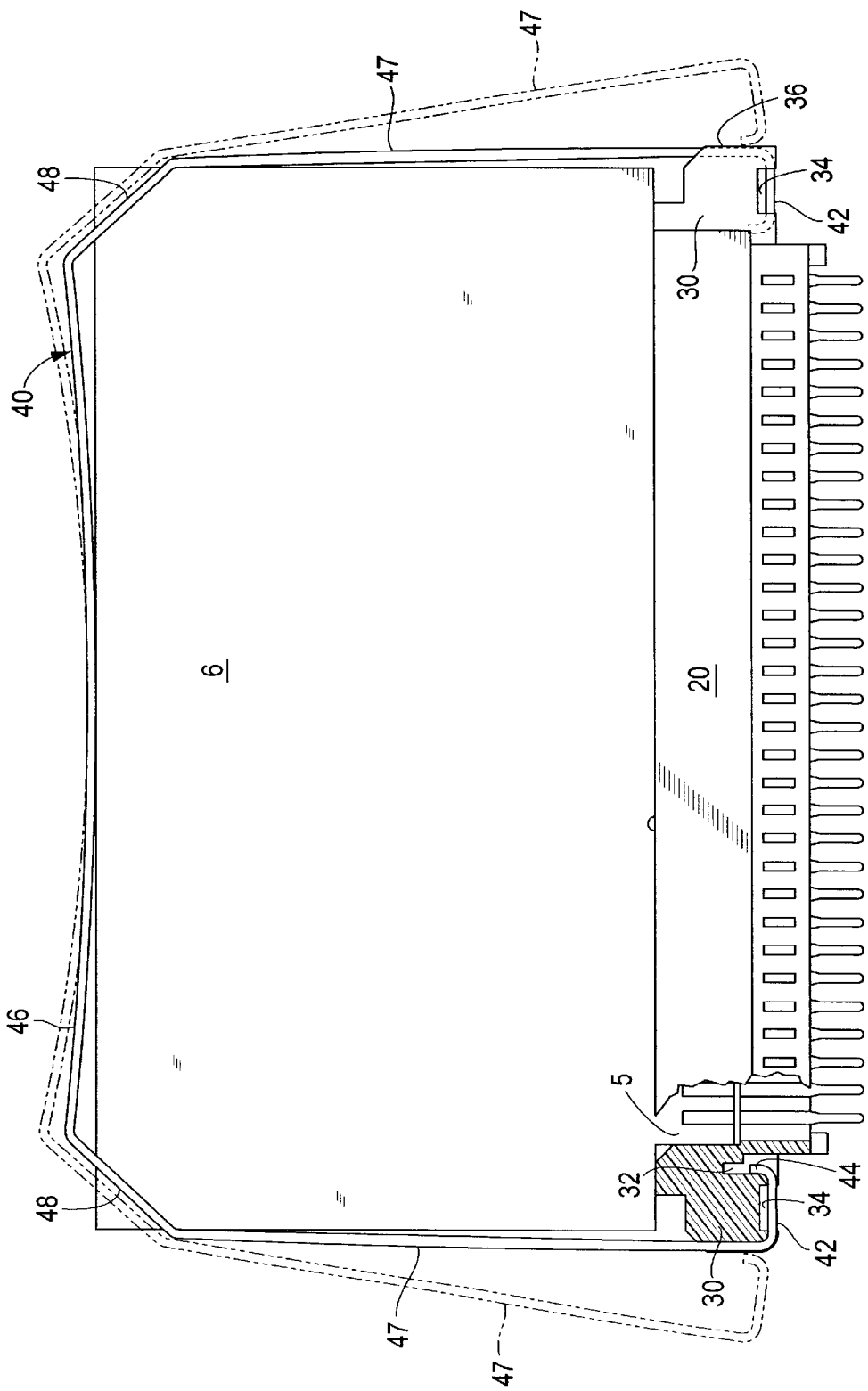
FIG. 3 is a side view of an alternative embodiment of the present invention with a spring clip shown in phantom in a released position and a partial cut-away view of an end of the connector.
Figure 5:
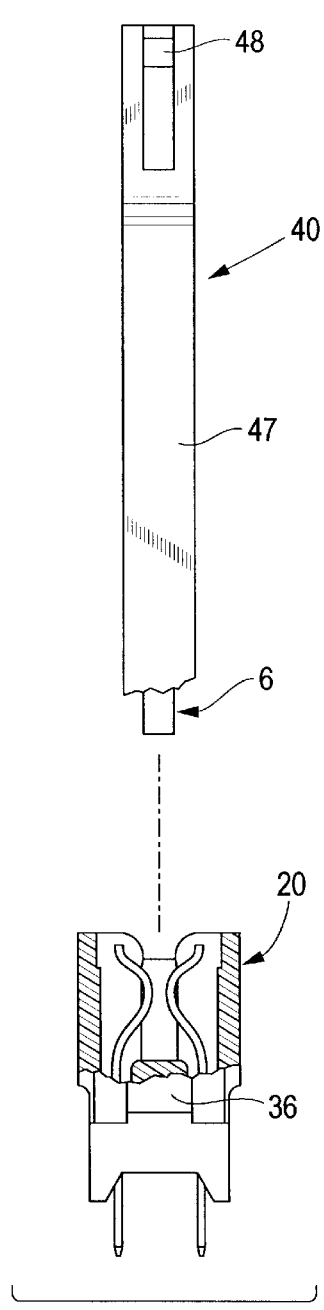
FIG. 5 is an exploded end view of an electrical connector, printed circuit board and spring clip in accordance with the present invention, with a partial cut-away view of an end of the connector.

An alternative embodiment is shown in greater detail in FIG. 3. Each end of card edge connector 20 is provided with a retention area 30 for securing spring clip 40 to card edge connector 20. Retaining area 30 comprises a notch 32 formed in the bottom of card edge connector 20 for receiving a tab 44 formed on a free end 42 of spring clip 40. A lateral groove 34 is formed in the bottom surface of card edge connector 20 proximate free end 42 and provides an area for receiving a tool for removal of spring clip 40. Retaining area 30 further provides a clip groove 36 for positioning a length of spring clip 40 therein.

Figure 8:
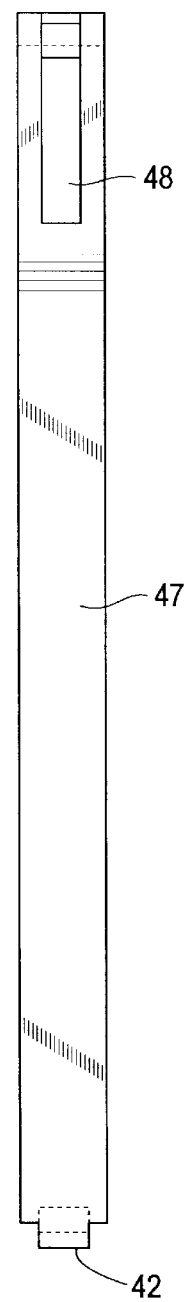
FIG. 8 is an end view of the spring clip of FIG. 6.
Figure 7:
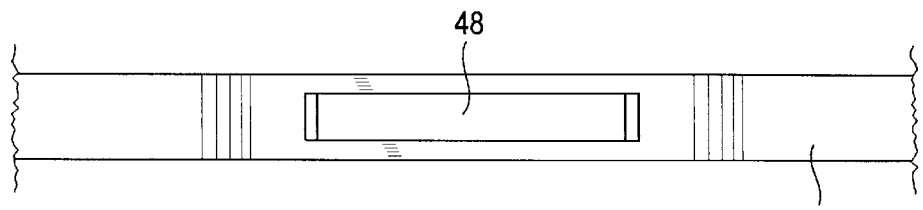
FIG. 7 is a top view of a cornered portion of the spring clip of FIG. 6.
Figure 6:
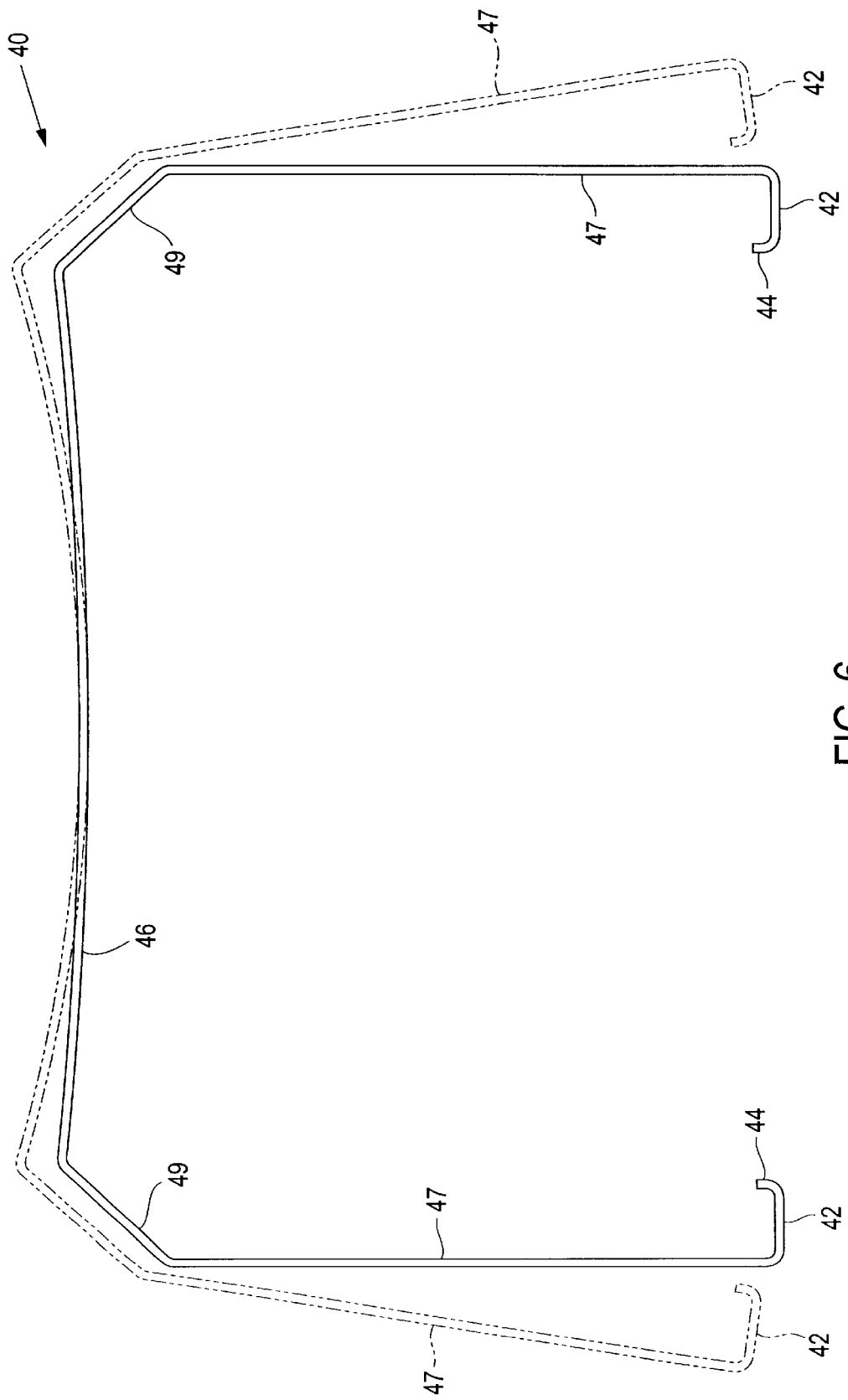
FIG. 6 is a side view of a spring clip in accordance with the present invention, wherein the spring clip is shown in phantom in a released position.

Spring clip 40 is shown in greater detail in FIGS. 6–8. In this embodiment, spring clip 40 has relatively straight sides 47 with a bowed top portion 46. Slots 48 are formed in cornered portions 49 disposed between bowed portion 46 and sides 47. Sides 47 extend downwardly to free ends 42 which are bent inwardly and terminate at tabs 44. Spring clip 40 may be stamped and formed from stainless steel which imparts a desired spring response in the clip. As shown in FIGS. 3 and 6 in phantom, spring clip 40 may be deflected outwardly away from card edge connector 20 to a released position in order to insert card edge 5 of printed circuit board 6 into the card-edge receiving recess 22 of card edge connector 20. Upon insertion of printed circuit board 6 into card edge connector 20, spring clip 40 resiles inwardly toward card edge connector 20 such that tabs 44 become seated in notches 32 and a length of sides 47 becomes positioned within clip grooves 36.

FIGS. 1 and 3 show card edge connector 4 and 20, respectively, with printed circuit board 6 secured in place by spring clips 8 and 40, respectively. Corners of printed circuit board 6 are received through slots 16 and 48 in order to secure printed circuit board 6 laterally with respect to card edge connectors 4 and 20. In FIG. 1, bowed sections 14 bear against side and top edges of printed circuit board 6 thereby firmly securing printed circuit board 6 within card edge connector 4. Similarly, in FIG. 3, sides 47 and bowed portion 46 press against side and top edges of printed circuit board 6 thereby firming securing it within the card edge connector 20. Both spring clips 8 and 40 and printed circuit board 6 are further resisted from wobbling by way of clip grooves 9 and 36. The spring clips are easily removable by inserting a tool in lateral grooves 13 or 32 in order to release the spring clip from the card edge connector. Upon release of the spring clip from the card edge connector the printed circuit board may be removed or replaced.

Accordingly, a sturdy, inexpensive and reliable retention member has been disclosed for retaining a printed circuit board within a card edge connector. It should be understood from the foregoing disclosure that the spring clip discussed herein may be constructed of various materials which provide adequate spring characteristics in order to retain a printed circuit board within an electrical connector. For instance, a clip could be molded from a sturdy plastic material or stamped from a blank of metal other than stainless steel.

Additionally, it should be understood that free ends of the spring clip may be secured to the electrical connector in various fashions such as by inserting free ends 42 into slots in the sides of the electrical connector.

While particular elements, embodiments and applications of the present invention have been shown and described, it will be understood that the invention is not limited thereto since modifications may be made by those skilled in the art, particularly in light of the foregoing teachings. It is therefore contemplated by the appended claims to cover such modifications as incorporate those features which come within the spirit and scope of the invention.

We claim:
1. An electrical connector comprising:
a housing having a card-receiving recess for receiving an edge of a printed circuit card therein;
a generally U-shaped clip having free ends attachable to a retention area on the housing and slots disposed remote from the free ends for receipt of corners of the printed circuit card.
2. The electrical connector of claim 1, wherein the retention area of the housing is comprised of notches in ends of the housing.
3. The electrical connector of claim 2, wherein tabs are provided on the free ends of the clip for insertion into the notches.
4. The electrical connector of claim 2, wherein the notches are disposed on a bottom surface of the housing.
5. The electrical connector of claim 1, wherein a tool-receiving slot is disposed in the housing, such that at least one of the free ends overlies the tool-receiving slot.
6. The electrical connector of claim 1, wherein the clip has bowed portions.
7. The electrical connector of claim 1, wherein a portion of the clip is seated in a groove in an end of the housing.
8. The electrical connector of claim 1, wherein the clip is stamped and formed from stainless steel.
9. An electrical connection comprising:
a printed circuit card;
a housing having a card-receiving recess for receiving an edge of the printed circuit card;
a generally U-shaped clip wrapped around a top and sides of the printed circuit card and releasably attached to the housing at free ends of the clip, the clip having slots for receiving corners of the printed circuit card therethrough.
10. The electrical connection of claim 9, wherein the free ends of the clip are seated in notches in the housing.
11. The electrical connection of claim 9, wherein the clip overlies a tool-receiving slot disposed in the housing.
12. The electrical connection of claim 9, wherein a portion of the clip is received in a groove in each end of the housing.
13. The electrical connection of claim 9, wherein the clip has bowed portions.
14. A clip for securing a printed circuit card in an electrical connector, comprising:
a generally U-shaped body terminating at free ends; and
slotted corner portions located remote of the free ends and connected thereto by bowed portions.
15. The clip of claim 14, wherein the body is stamped and formed from stainless steel.
16. The clip of claim 14, wherein the slotted corner portions are connected by a bowed top portion.
17. The clip of claim 14, wherein the free ends have inwardly directed tabs.
18. An assembly comprising:
a printed circuit card;
an electrical connector having a card-receiving recess for receiving an edge of the printed circuit card; and
a generally U-shaped clip disposed around the printed circuit card and ends of the electrical connector, the clip has free ends secured in notches in the electrical connector and corners of the printed circuit card are disposed in slotted corners of the clip located remote from the free ends, thereby securing the printed circuit card in the electrical connector.

* * * * *